United States Patent [19]

Taylor

[11] Patent Number: 5,684,420

[45] Date of Patent: Nov. 4, 1997

[54] SMALL SIGNAL AMPLIFIER FOR INDEPENDENT P-CHANNEL AND N-CHANNEL DRIVES

[75] Inventor: Clive Roland Taylor, Welwyn Garden City, England

[73] Assignee: VLSI Technology, Inc., San Jose, Calif.

[21] Appl. No.: 654,544

[22] Filed: May 29, 1996

[51] Int. Cl.$^6$ ........................................... H03K 3/00
[52] U.S. Cl. ........................ 327/112; 327/427; 327/108
[58] Field of Search ................................... 327/108, 109, 327/111, 112, 427, 379, 382, 383, 384, 560–563, 175; 326/26, 27, 122

[56] References Cited

U.S. PATENT DOCUMENTS

| | | | |
|---|---|---|---|
| 5,315,187 | 5/1994 | Cheng | 327/379 |
| 5,430,335 | 7/1995 | Tanoi | 327/108 |
| 5,491,436 | 2/1996 | Austin | 327/379 |
| 5,587,678 | 12/1996 | Dijkmans | 327/111 |

*Primary Examiner*—Toan Tran
*Attorney, Agent, or Firm*—Wagner, Murabito & Hao

[57] ABSTRACT

A CMOS small-signal amplifier is arranged to drive separately but in synchronism the transistors of an output stage comprising a first output transistor of a first conductivity type and a second output transistor of a second conductivity type. Each of these output transistors is driven by a respective intermediate stage comprising a current source transistor and a driver transistor directly coupled to an input terminal and a control node of the respective output transistor. The current source transistors are biassed such that the said output transistors have a symmetrical duty cycle. There may be a single bias line connected to a current source transistor in one intermediate stage and a system of current mirrors coupling the bias line to the current source transistor in the other intermediate stage.

7 Claims, 1 Drawing Sheet

SMALL SIGNAL AMPLIFIER FOR INDEPENDENT P-CHANNEL AND N-CHANNEL DRIVES

FIELD OF THE INVENTION

This invention relates to electronic amplifiers and particularly to a small signal amplifier for use in CMOS circuits. It is particularly but not exclusively intended for use in low power oscillators.

BACKGROUND TO THE INVENTION

The invention particularly concerns a small signal amplifier which is intended for driving an inverter with a small amplitude signal and to minimize crowbar currents, arising from lack of synchronism of the current to the p-channel and n-channel devices and, preferably, to achieve a symmetrical (50:50) duty cycle from a small amplitude input that is biassed or has an equilibrium position at one of the threshold voltages (such as the n-channel threshold voltage VTN) of the CMOS circuit.

It is known to provide independent drives to a p-channel transistor and an n-channel transistor coupling capacitors and reverse bias diodes.

It would be possible merely to amplify the input signal up to a rail-to-rail swing. However, such a solution is unsatisfactory because it consumes substantial current and has an inherently poor, that is to say markedly asymmetric, duty cycle.

The present invention provides a means of separately driving n and p-channel devices of an output stage with appropriately synchronized small amplitude signals, with a small current consumption and while avoiding capacitative coupling which is particularly undesirable at high frequencies of operation.

The invention is based on the provision of an input stage, which in an oscillator embodiment would be coupled to a crystal or other frequency selective circuit and comprises, for example, a current source of a first conductivity type (e.g. p-channel) and a driver of a second conductivity type (e.g. n-channel) current source. An output stage has two transistors one of each conductivity type. One of them is driven by a first intermediate stage which is a scaled down version of the input stage, and has a current source biassed similarly to the current driver in the input stage. The other transistor in the output stage is driven by a second intermediate stage similar to the first intermediate stage but biassed so as to shift the operating point appropriately for that other transistor. The signal paths from the input to the control nodes of the transistors in the output stage are direct and similar, so that the signals at these nodes are subject to the same delay and are thereby synchronized.

BRIEF DESCRIPTION OF THE DRAWING

The single FIGURE illustrates a small signal amplifier according to the invention.

DETAILED DESCRIPTION OF A PREFERRED EMBODIMENT

Figure 1:
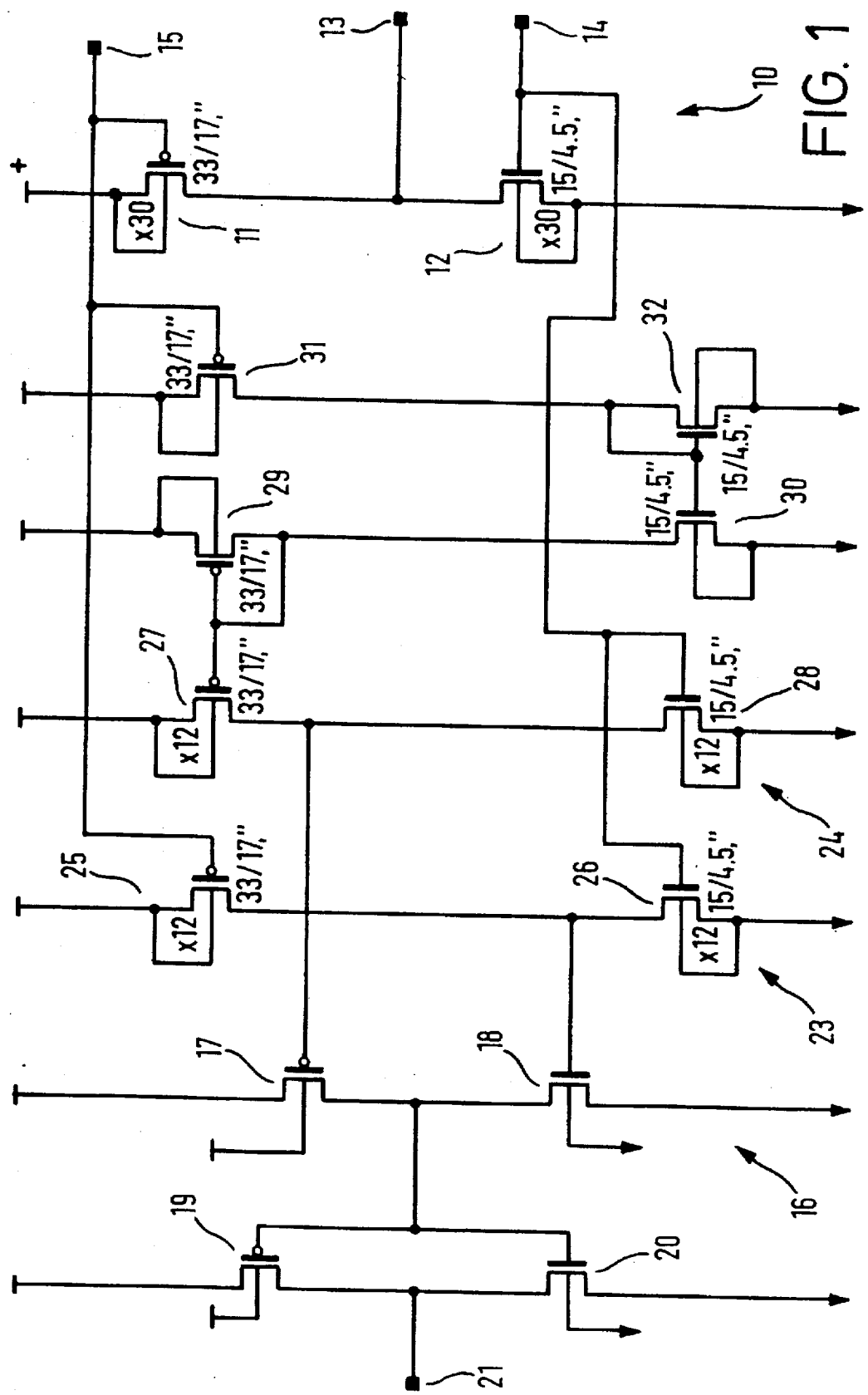

The small signal amplifier described in the FIGURE is intended for manufacture by a p-well process. In this amplifier, the current sources in an input stage and intermediate stages are p-channel transistors which provide current for n-channel transistors but the invention is adaptable for use conversely, in an n-well process wherein the current sources are the n-channel devices.

In the circuit shown in the FIGURE, an input stage 10 is constituted by a current source 11, in this embodiment a p-channel transistor and a driver 12, in this embodiment an n-channel transistor of which the drain is connected to the drain of the current source transistor 11. The input terminals of the circuit are terminal 13, connected to the drain of transistor 12, and terminal 14, connected to the gate of transistor 12. These input terminals may, if the amplifier forms part of an oscillator circuit, be connected to a crystal or other frequency selective network. Bias for the current source transistor 11 is provided by a bias line 15. The operating point for this stage is the voltage threshold (VTN) pertinent to the transistor 12 (n-channel in this embodiment).

The purpose of the circuit is to provide from the input signal drive for an inverter 16 constituted by a p-channel transistor 17 and an n-channel transistor 18. In this embodiment the inverter 16 drives an output buffer stage comprising a p-channel transistor 19 and an n-channel transistor 20, the gates of the transistors 19 and 20 being connected in common to the drains of the inverter stage 16. Thus a final output may be taken from a terminal 21 connected to the common drains of the transistors 19 and 20.

The transistors in the inverter 16 are separately driven by respective intermediate stages 23 and 24. In particular, the n-channel transistor 18 is driven by the stage 23 which is a scaled down version of the input stage 10 and comprises a p-channel current source transistor 25 and an n-channel driver transistor 26, of which the drain is connected to the drain of the transistor 25 and to the gate of transistor 18, and the gate is connected to the gate of transistor 12 and input terminal 14. The current source for transistor 25 has its gate biassed by exactly the same voltage as that which biases the transistor 11, the gate of transistor 25 being connected to the gate of transistor 11 and to the bias line 15.

The p-channel transistor in the inverter 16 is likewise driven by the second intermediate stage 24 comprising a current source (p-channel) transistor 27 and a driver (n-channel) transistor 28. The gate of driver transistor 28 is connected to the gate of the transistor 12 and thereby to the input terminal 14. The current source transistor 27 in the second intermediate stage is biassed by a voltage which is derived by a system of current mirrors which change the equilibrium voltage from VTN to VTP.

In particular, the current source transistor in the second intermediate stage 24 forms a current mirror with a p-channel transistor 29, of which the gate is connected to the drain and the drain is connected to the drain of an n-channel transistor 30 which forms a current mirror with another n-channel transistor 32 of which the gate is connected to the drain and the drain is connected to the drain of a p-channel transistor 31 of which the gate is connected to the line 15.

It may be noted that the signal path from the input terminal 14 to the gate of the transistor 18 consists of a direct connection to the gate of the driver transistor 26 in the first intermediate stage 23 and a direct connection to the drain of this transistor to the gate of transistor 18. The signal path from the input to the gate of the p-channel transistor 17 consists of a direct connection from the input terminal 14 to the gate of the drive transistor 28 in the second intermediate stage 24 and the direct connection of the drain of this transistor to the gate of transistor 17. The two transistors 26 and 28 are similarly scaled down versions of the driver transistor 12 in the input stage 10. Thus, the two signal paths are identical and therefore the drive signals applied to the gates of transistors 17 and 18 are synchronized, thereby minimizing any crowbar current.

The amplitude of oscillation can be less than the nominal minimum value (0.8 volts) and the signals at the gates of transistors 17 and 18 can likewise be small. Accordingly, the circuit may operate with minimal consumption of current from the supply rails.

I claim:

1. A CMOS amplifier comprising:

(i) an input stage comprising a first current source transistor of a first conductivity type and a first drive transistor of a second conductivity type;

(ii) an input terminal connected to a control node of said driver transistor;

(iii) means providing a control bias for said first current source;

(iv) an output stage comprising a first output transistor of said first conductivity type and a second output transistor of said second conductivity type;

(v) a first intermediate stage having a second current source transistor and a second driver transistor, means connecting a control node of said second driver transistor to said input terminal and means connecting an output node of said second driver transistor to a control node of said second output transistor;

(vi) a second intermediate stage comprising a third current source transistor and a third driver transistor, means connecting a control node of said third current driver transistor to said input terminal and means connecting an output node of said third driver transistor to a control node of said first output transistor; and (vii) means for providing control bias for said second and third current source transistor to set respective equilibrium voltages for the control nodes of said first and second output transistors.

2. An amplifier according to claim 1 wherein each of said first and second intermediate stages is a scaled down version of said input stage.

3. An amplifier according to claim 1 wherein said means for providing bias comprises, for said first intermediate stage, means for providing for said second current source transistor the same control bias as for said first current source transistor in said input stage and comprises for said second intermediate stage a current mirror coupling from said control bias to said third circuit source transistor.

4. An amplifier according to claim 1 wherein said means for providing control bias comprises:

a bias line providing said control bias to said first current source transistor;

means connecting a control node of said second current source transistor to receive said control bias;

a control transistor of said first conductivity type connected to receive said control bias at a control node;

a first current mirror of said first conductivity type and including said third current source transistor; and a second current mirror of said second conductivity type, connected to said control transistor and said first current mirror.

5. An amplifier according to claim 4 wherein the means for providing control bias sets the equilibrium points for the control nodes of the first and second output transistors at the respective one of the conduction threshold voltages for the first and second conductivity type.

6. In a CMOS small-signal amplifier the combination comprising:

(a) an output stage comprising a first output transistor of a first conductivity type and a second output transistor of a second conductivity type;

(b) a first intermediate stage comprising a first driver transistor directly coupled to an input terminal and a control node of said second output transistor and a first current source transistor;

(c) a second intermediate stage comprising a second driver transistor directly coupled to said input terminal and a control node of said first output transistor and a second current source transistor; and (d) means for biasing said first and second current source transistors such that said output transistors have a symmetrical duty cycle.

7. The combination according to claim 6 wherein said biasing means comprises a bias line for said first current source transistor and a system of current mirrors coupled between said bias line and said second current source transistor.

* * * * *